(12) United States Patent
Amano

(10) Patent No.: US 7,212,954 B2
(45) Date of Patent: May 1, 2007

(54) INFORMATION PROCESSING APPARATUS, FAILURE MONITORING METHOD AND FAILURE MONITORING COMPUTER PROGRAM

(75) Inventor: Kazuhiko Amano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/104,606

(22) Filed: Apr. 13, 2005

(65) Prior Publication Data
US 2006/0173655 A1 Aug. 3, 2006

(30) Foreign Application Priority Data
Jan. 28, 2005 (JP) .............................. 2005-020787

(51) Int. Cl.
*G06F 1/28* (2006.01)
(52) U.S. Cl. .......................... 702/185; 702/58; 702/61; 702/60; 713/340
(58) Field of Classification Search ................ 702/185, 702/57–62, 64, 65, 117, 118, 127, 182, 183, 702/186, 187, 189, 188, 193
See application file for complete search history.

(56) References Cited

U.S. PATENT DOCUMENTS 5,691,870 A * 11/1997 Gebara .................... 361/86
5,801,522 A * 9/1998 McKenzie ................. 323/303
6,289,467 B1 * 9/2001 Lewis et al. ............... 713/340
6,465,908 B1 * 10/2002 Karuppana et al. .......... 307/31
6,859,882 B2 * 2/2005 Fung ....................... 713/300
2005/0240814 A1 * 10/2005 Sasakura et al. ............. 714/14

FOREIGN PATENT DOCUMENTS

| JP | 09-251334 | 9/1997 |
| JP | 10-282161 | 10/1998 |
| JP | 2000-267766 | 9/2000 |
| JP | 2000-324722 | 11/2000 |

* cited by examiner

*Primary Examiner*—Hal Wachsman
(74) *Attorney, Agent, or Firm*—Staas & Halsey LLP

(57) ABSTRACT

An information processing apparatus including a plurality of modules that are provided for each information processing feature, a plurality of switches that are provided respectively for the modules so as to turn on and off the power supply to the respective modules connected to them, a power supply metering section that meters the power supply to the modules, a memory section that stores a normal range of power supply in advance and a control section that controls the switches so as to turn off the power supply to a specific module when the outcome of the metering by the power supply metering section is out of the normal range of power supply as stored in the memory section.

14 Claims, 5 Drawing Sheets

| bay ID | module ID | serial No. | version information |
|---|---|---|---|
| Slot-00 | ADP-CA0 | #12345 | B |
| Slot-01 | ADP-DA0 | #12346 | C |
| Slot-02 | CM0 | #98765 | E |
| Slot-03 | CM0 | #09874 | E |
| Slot-04 | CM0 | #09875 | E |
| Slot-05 | HDD36H1 | #10203 | A |

| module ID | expected electric current consumption value | emergency deviation | diagnosis deviation |
|---|---|---|---|
| ADP-CA0 | 3.5 | ±3 | ±1 |
| ADP-DA0 | 4.1 | ±4 | ±1 |
| CM0 | 10.0 | ±6 | ±3 |
| HDD36H1 | 1.2 | ±2 | ±0.5 |

FIG. 5

| electric current metering section ID | expected electric current consumption value | emergency deviation | diagnosis deviation | metered electric current consumption value |
|---|---|---|---|---|
| A | 13.5 | ±9 | ±4 | 14.0 |
| B | 14.1 | ±10 | ±4 | 14.5 |
| C | 11.2 | ±8 | ±3.5 | 10.9 |
| D | 2.4 | ±4 | ±1 | 2.2 |
| E | 1.2 | ±2 | ±0.5 | 1.3 |

INFORMATION PROCESSING APPARATUS, FAILURE MONITORING METHOD AND FAILURE MONITORING COMPUTER PROGRAM

BACKGROUND OF THE INVENTION

1. Field of the Invention

This invention relates to an information processing apparatus, a failure monitoring method and a failure monitoring computer program for monitoring failures attributable to degradation of electronic parts.

2. Description of Related Art

In recent years, there has been an increasing demand for information processing apparatus that operate as infrastructures 24 hours a day and 365 days a year. Such an information processing apparatus is normally designed to provide the modules it comprises with redundancy and the apparatus itself with a self-diagnostic feature. If one or more than one of the modules fall into trouble, they are isolated and a user is notified of the trouble and prompted to replace the modules that are in trouble. However, such a self-diagnostic feature is adapted to detect logical problems of the circuits of the apparatus and hence it is difficult for the apparatus to recognize an abnormal condition caused by a failure of any of the electric parts that constitute analog circuits. Generally, the impedance of semiconductor parts falls as they are degraded. Then, an excessive electric current can flow to give rise to a problem of short-circuiting as the degradation of the semiconductor parts progresses.

However, logical circuits take only values of 0 and 1 that are produced by using the saturating point operation of an amplifier. Therefore, conventional logical verification techniques cannot detect any increase in the electric current that is produced by the degradation of a semiconductor element. Additionally, an abnormal condition due to a failure of a power supply circuit appears suddenly as a phenomenon of short-circuiting or an open circuit when the progressing degradation of a part goes above a threshold value. When a failure of a power supply circuit occurs, the entire apparatus can be seriously damaged to give rise to a big problem.

SUMMARY OF THE INVENTION

In view of the above identified circumstances, it is therefore an object of the present invention to provide an information processing apparatus, a failure monitoring method and a failure monitoring computer program that can prevent serious problems from arising by recognizing the increase in the electric current consumption that is caused by a change in the impedance of an electronic part and predicting the trouble that can occur in the related logic circuit and/or the power supply circuit or, if the trouble occurs, detecting it quickly.

In an aspect of the present invention, the above object is achieved by providing an information processing apparatus that monitors failures comprising: a plurality of modules that are provided for each information processing feature; a plurality of switches that are provided respectively for the modules so as to turn on and off the power supply to the respective modules connected to them; at least a power supply metering section that meters the power supply to the modules; a memory section that stores a normal range of power supply in advance; and a control section that controls the switches so as to turn off the power supply to a specific module when the outcome of the metering by the power supply metering section is out of the normal range of power supply as stored in the memory section.

Preferably, in an information processing apparatus according to the invention, the power supply metering section is provided for each of the modules or each group of modules formed by dividing the modules.

Preferably, in an information processing apparatus according to the invention, the memory section stores a normal range of power supply for each of the modules in advance and the control section computes the normal range of power supply for the power supply metering section or each of the power supply metering sections on the basis of the normal range of power supply for each of the modules and the configuration of the modules in the information processing apparatus, while the memory section stores the normal range of power supply for the power supply metering section or each of the power supply metering sections.

Preferably, in an information processing apparatus according to the invention, the control section recognizes the configuration of the modules in the information processing apparatus by communicating with the modules.

Preferably, in an information processing apparatus according to the invention, the memory section stores a first normal range and a second normal range that is broader than the first normal range in advance as the normal range and the control section turns off the power supply to all the modules when the metered power supply is out of the second normal range but identifies the abnormal module and turns off the power supply to the abnormal module when the metered power supply is out of the first normal range.

Preferably, in an information processing apparatus according to the invention, when the power supply is out of the first normal range, the control section selects one of the modules operating under the power supply metering section for which the power supply is detected to abnormal, turns off the power supply to the selected module and repeats the selection of one of the modules until the abnormal power supply is no longer detected on the basis of the outcome of the metering by the power supply metering section and the normal range stored in the memory section.

Preferably, in an information processing apparatus according to the invention, the power supply metering section or each of the power supply metering sections meters the electric current consumption of the modules and the memory section stores the normal range as current consumption.

Preferably, in an information processing apparatus according to the invention, the memory section further stores a normal range for the change in the power supply to the power supply metering section or each of the power supply metering sections and the outcome of the past metering operations of the power supply metering section or each of the power supply metering sections and the control section controls the switches so as to turn off the power supply to a specific module when the change in the power supply as obtained from the outcome of the past metering operations of the power supply metering section or each of the power supply metering sections is out of the normal range for changes in the power supply as stored in the memory section.

In another aspect of the present invention, there is provided a failure monitoring method of monitoring failures of an information processing apparatus having a plurality of modules, the method comprising: a storing step that stores a normal range of power supply to the modules in advance; at least a power supply metering step that meters the power supply to the modules; and a control step that turns off the power supply to a specific module when the power supply to the module is out of the normal range as stored in the storing step as a result of metering in the power supply metering step or steps.

Preferably, in a failure monitoring method according to the invention, the power supply metering step or each of the power supply metering steps is conducted for each of the modules or each group of modules formed by dividing the modules.

Preferably, in a failure monitoring method according to the invention, the storing step is adapted to store a normal range of power supply for each of the modules in advance and the control step is adapted to compute the normal range of power supply for the power supply metering step or each of the power supply metering steps on the basis of the normal range of power supply for each of the modules and the configuration of the modules in the information processing apparatus, while the storing step is also adapted to store the normal range of power supply for the power supply metering step or each of the power supply metering steps.

Preferably, in a failure monitoring method according to the invention, the control step is adapted to recognize the configuration of the modules in the information processing apparatus by communicating with the modules.

Preferably, in a failure monitoring method according to the invention, the storing step is adapted to store a first normal range and a second normal range that is broader than the first normal range in advance as the normal range and the control step is adapted to turn off the power supply to all the modules when the metered power supply is out of the second normal range but identify the abnormal module and turn off the power supply to the abnormal module when the metered power supply is out of the first normal range.

Preferably, in a failure monitoring method according to the invention, when the power supply is out of the first normal range, the control step is adapted to select one of the modules operating under the power supply metering step in which the power supply is detected to abnormal, turn off the power supply to the selected module and repeat the selection of one of the modules until the abnormal power supply is no longer detected on the basis of the outcome of the metering in the power supply metering step and the normal range stored in the storing step.

Preferably, in a failure monitoring method according to the invention, the power supply metering step or each of the power supply metering steps is adapted to meter the electric current consumption of the modules and the storing step is adapted to store the normal range as electric current consumption.

Preferably, in a failure monitoring method according to the invention, the storing step is adapted to further store a normal range for the change in the power supply in the power supply metering step or each of the power supply metering steps and the outcome of the past metering operations of the power supply metering step or each of the power supply metering steps and the control step is adapted to turn off the power supply to a specific module when the change in the power supply as obtained from the outcome of the past metering operations in the power supply metering step or each of the power supply metering steps is out of the normal range for changes in the power supply as stored in the storing step.

In a further aspect of the present invention, there is provided a failure monitoring computer program for causing a computer to execute a failure monitoring method of monitoring failures of an information processing apparatus having a plurality of modules, the method comprising: a storing step that stores a normal range of power supply to the modules in advance; at least a power supply metering step that meters the power supply to the modules; and a control step that turns off the power supply to a specific module when the power supply to the module is out of the normal range as stored in the storing step as a result of metering in the power supply metering step or steps.

Thus, according to the invention, it is possible to predict a trouble of an apparatus due to a failure of an element of the apparatus, identify an abnormal module and isolate it from the apparatus by monitoring the electric currents to the modules in addition to the conventional logical diagnostic feature.

BRIEF DESCRIPTION OF THE DRAWINGS

FIG. 5 is an exemplary table of information on the electric current consumption of the apparatus to the present invention;

DETAILED DESCRIPTION OF THE PREFERRED EMBODIMENTS

Now, preferred embodiments of the present invention will be described in greater detail by referring to the accompanying drawings.

Figure 1:
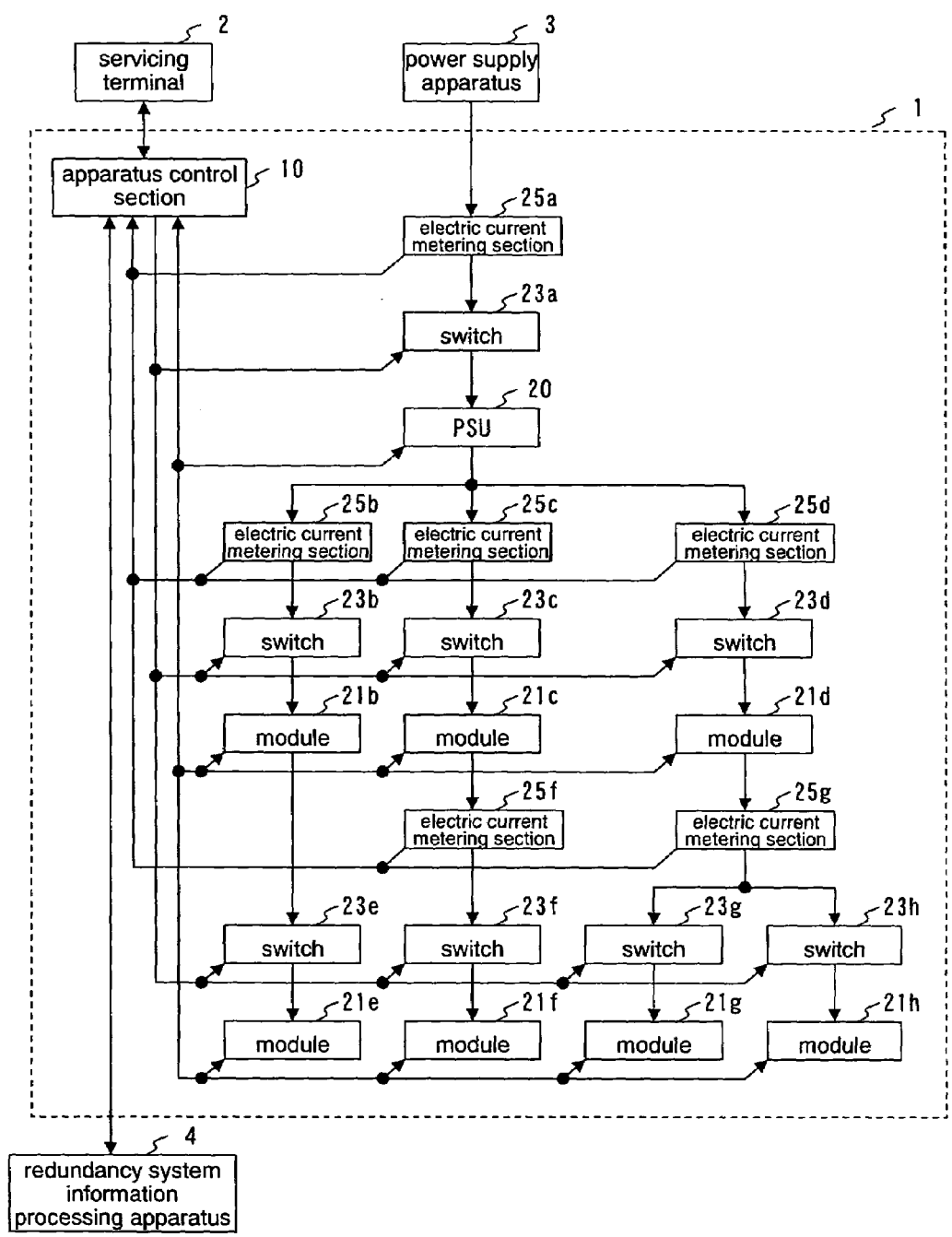
FIG. 1 is a schematic block diagram of an embodiment of information processing apparatus according to the invention, showing the configuration thereof.

Firstly the configuration of an information processing apparatus according to the invention will be described. FIG. 1 is a schematic block diagram of an embodiment of information processing apparatus according to the invention, showing the configuration thereof. Referring to FIG. 1, the information processing apparatus 1 comprises an apparatus control section 10, a PSU (power supply unit) 20, modules 21b, 21c, 21d, 21e, 21f, 21g, and 21h, switches 23a, 23b, 23c, 23d 23e, 23f, 23g, and 23h and electric current metering sections 25a, 25b, 25c, 25d, 25f, and 25g.

The apparatus control section 10 controls the overall operation of the information processing apparatus and is connected to a servicing terminal 2 and a redundancy system information processing apparatus 4 that are external to the apparatus. The servicing terminal 2 is a terminal for servicing the information processing apparatus 1. It is so designed as to be operated by the manager of the information processing apparatus 1. The redundancy system information processing apparatus 4 has a configuration similar to that of the information processing apparatus 1 and is provided so as to operate as spare apparatus. It is driven to operate when the information processing apparatus 1 does not operate properly.

The output power of the power supply apparatus 3 is firstly input to the PSU 20 by way of the electric current metering section 25a and the switch 23a. The output power of the PSU 20 is input to the module 21b by way of the electric current metering section 25b and the switch 23b, to the module 21c by way of the electric current metering section 25c and the switch 23c and to the module 21d by way of the electric current metering section 25d and the switch 23d. The output power of the module 21b is input to the module 21e by way of the switch 23e. The output power of the module 21c is input to the module 21f by way of the electric current metering section 25f and the switch 23f. The output power of the module 21d is input to the switch 23g and switch 23h by way of the electric current metering section 25g. The output power of the switch 23g is input to the module 21g, while the output power of the switch 23h is input to the module 21h.

As pointed out above, the electric current metering sections, the switches and the modules are combined and connected in various different ways. Each module may be provided with an electric current metering section or a plurality of modules may be provided with an electric current metering section. Each switch is adapted to turn on and off the power supply to the module connected to it according to the command given to it from the apparatus control section 10.

Figures 2, 3, 4:
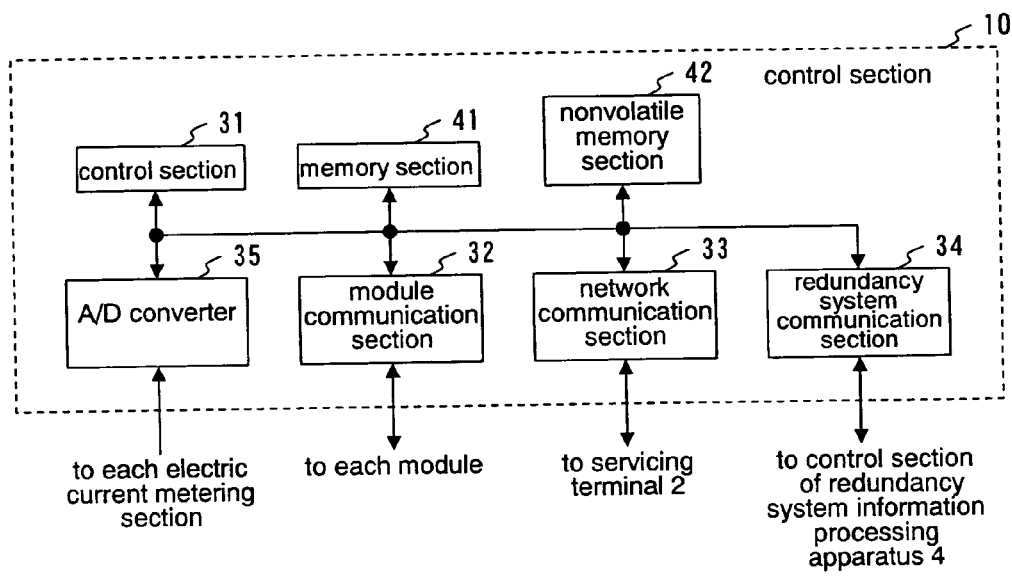
FIG. 2 is a schematic block diagram of an apparatus control section according to the present invention, showing the configuration thereof.
FIG. 3 is an exemplary table of information on the configuration of the apparatus according to the present invention.
FIG. 4 is an exemplary table of information on the modules of the apparatus to the present invention.

FIG. 2 is a schematic block diagram of an apparatus control section according to the present invention, showing the configuration thereof. Referring to FIG. 2, the apparatus control section 10 has a control section 31, a network communication section 33, a module communication section 32, a redundancy communication section 34, an A/D converter 35, a memory section 41 and a nonvolatile memory section 42.

The control section 31 communicates with the network communication section 33, the module communication section 32 and the redundancy communication 34 in order to control the entire information processing apparatus. The network communication section 33 communicates with the servicing terminal 2. The module communication section 32 communicates with the PSU (power supply unit) 20 and the modules 21b, 21c, and 21d. The redundancy communication section 34 communicates with the apparatus control section of the redundancy system information processing apparatus 4 for an occasion where the information processing apparatus 1 does not operate properly. The A/D converter 35 converts the analog values obtained as a result of metering the electric currents of the electric current metering sections 22a, 22b, 22c, and 22d into digital values and delivers them to the control section 31. The memory section 41 stores a table of information on the configuration of the apparatus, a table of information on the modules of the apparatus and a table of information on the electric current consumption of the apparatus. The nonvolatile memory section 42 stores the operations/states necessary for restoring the system of the information processing apparatus 1.

FIG. 3 is an exemplary table of information on the configuration of the apparatus according to the present invention. The table of information on the configuration of the apparatus includes items such as those for bay IDs for identifying the bays where the respective modules are mounted, module IDs for identifying the modules, the serial numbers of the modules, information on the number of edition and so on, all of which are defined in advance by way of the servicing terminal 2. FIG. 4 is an exemplary table of information on the modules of the apparatus according to the present invention. The table of information on the modules includes items such as those for module IDs, expected electric current consumption values, emergency deviations, diagnosis deviations and so on, all of which are defined in advance by way of the servicing terminal 2. FIG. 5 is an exemplary table of information on the electric current consumption of the apparatus according to the present invention. The table of information on the electric current consumption includes items such as expected electric current consumption values, emergency deviations, diagnosis deviations, metered electric current consumption values and so on for the respective electric current metering sections. An expected electric current consumption value is a value computed on the basis of the table of information on the configuration of the apparatus and the table of information on the modules of the apparatus. A metered electric current consumption value is the electric current consumption value metered by an electric current metering section.

Figure 6:
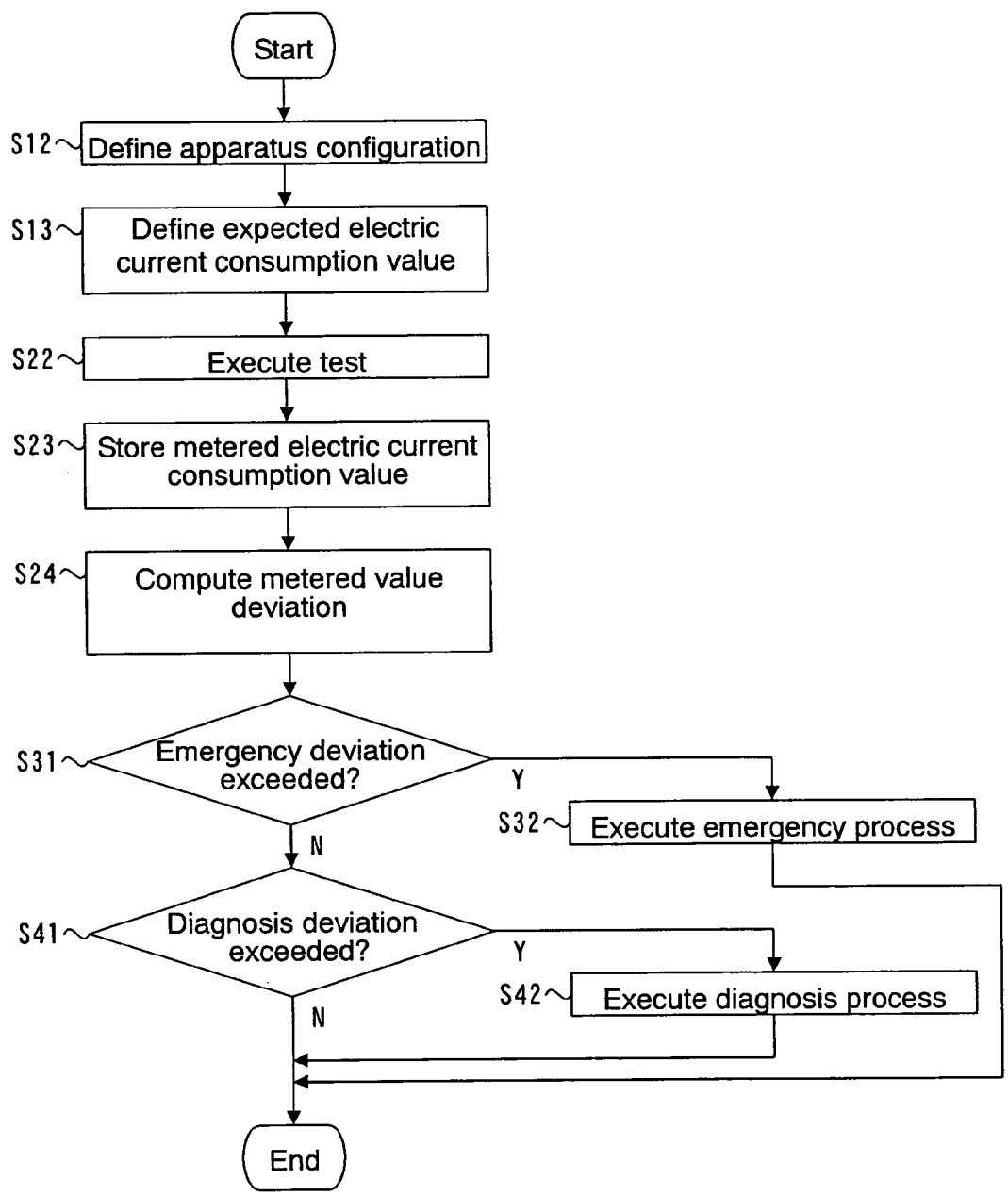
FIG. 6 is a flow chart of the failure monitoring operation of the information processing apparatus according to the present invention.

Now, the failure monitoring operation of the information processing apparatus according to the present invention will be described below. FIG. 6 is a flow chart of the failure monitoring operation of the information processing apparatus according to the present invention. The failure monitoring operation is carried out when the information processing apparatus 1 is started to operate or at the time of a regular checkup. The initial state of the information processing apparatus 1 is a normal state. The control section 31 communicates with the modules by way of the module communication section 32 to recognize the current configuration of the apparatus and redefines the table of information on the configuration of the apparatus according to the recognized current configuration (S12). However, the control section 31 may redefine the table of information on the configuration of the apparatus by way of the servicing terminal 2 without recognizing the current configuration of the apparatus. Then, control section 31 computes the expected electric current consumption value of each electric current metering section on the basis of the table of information on the configuration of the apparatus and the table of information on the modules and stores the value in the table of information on the electric current consumption of the apparatus (S13).

Subsequently, the control section 31 executes a test (S22). The information processing apparatus 1 is driven to operate in order to meter the electric current consumption of the apparatus in the test. More specifically, the information processing apparatus 1 is driven for a simple operation of processing predetermined data in the test. Then, the control section 31 stores the metered value of electric current consumption that is obtained from each of the electric current metering sections in the table of information on the electric current consumption of the apparatus (S23). Thereafter, the control section 31 computes the metered value deviation of each of the electric current metering sections that is the deviation of the metered electric current consumption value from the expected electric current consumption value of the electric current metering section (S24).

Then, the control section 31 determines if the metered value deviation of each of the electric current metering sections exceeds the emergency deviation or not (S31). If the metered value deviation of one of the electric current metering sections is determined to exceed the emergency deviation (S31, Y), the control section 31 judges that the information processing apparatus 1 is in an abnormal state and executes an emergency process (S32) to terminate the flow of operation. If, on the other hand, the metered value deviation of each and every one of the electric current metering sections does not exceed the emergency deviation (S31, N), the control section 31 then determines if the metered value deviation of each of the electric current metering sections exceeds the diagnosis deviation or not (S41). If the metered value deviation of one of the electric current metering section is determined to exceed the diagnosis deviation (S41, Y), the control section judges that the information processing apparatus 1 is in an abnormal state and executes a diagnosis process for the electric current metering section (S42) to terminate the flow of operation. If, finally, the metered value deviation of each and every one of the electric current metering sections does not exceed the diagnosis deviation (S41, N), the control section 31 terminates the flow of operation.

Here, the emergency process is a process of immediately suspending the power supply to all the modules under the electric current metering section whose metered value deviation exceeds the emergency deviation. The emergency process can prevent any abnormal operation of the information processing apparatus 1 due to a serious failure of any of the modules such as short-circuiting.

Further, the diagnosis process is a process of identifying the abnormal module out of the modules under the electric current metering section whose metered value deviation exceeds the diagnosis deviation and driving the information processing apparatus 1, while isolating the module that is in trouble. Furthermore, isolating a module refers to an operation of logically excluding a module in trouble from the configuration of the apparatus and stopping the power supply to the module. An electric current metering section whose metered value deviation exceeds the diagnosis deviation will be referred to as in-diagnosis electric current metering section hereinafter. Both the information processing apparatus 1 and the redundancy system information processing apparatus 4 have a certain degree of redundancy. In other words, if an abnormal module is isolated, the entire system of the information processing apparatus 1 does not fall in trouble because some other redundant module takes the role of the isolated module. If the system falls in trouble as a result of the isolation, the operations/states necessary for restoring the system of the information processing apparatus 1 are stored in the nonvolatile memory section 42 and the system is degenerated.

Figure 7:
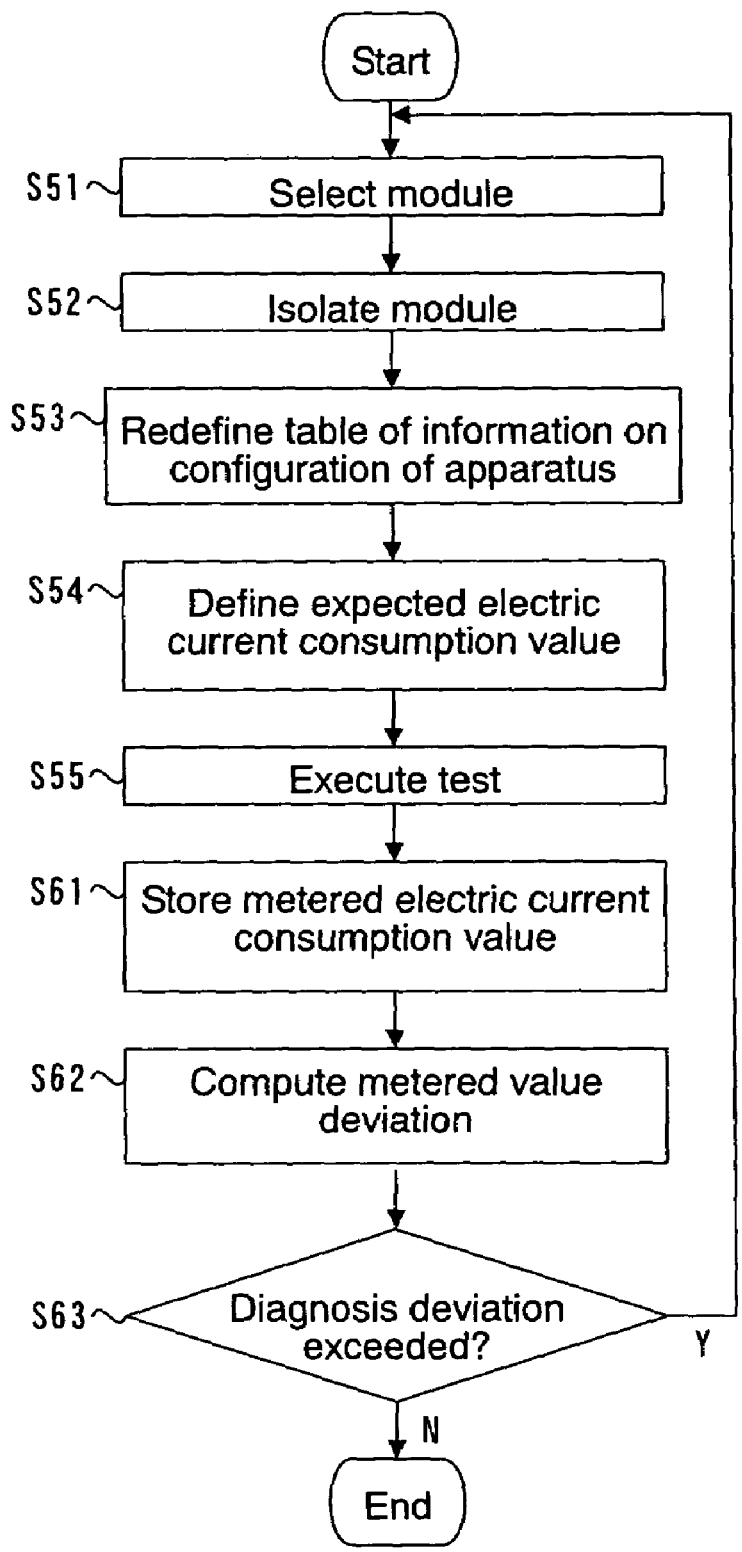
FIG. 7 is a flow chart of the diagnostic processing operation of the information processing apparatus according to the present invention.

FIG. 7 is a flow chart of the diagnostic processing operation of the information processing apparatus according to the present invention. Referring to FIG. 7, the control section 31 firstly selects one of the modules under the in-diagnosis electric current metering section (S51). Then, the control section 31 isolates the selected module and suspends the power supply to the isolated module (S52). Thereafter, the control section 31 redefines the configuration of the apparatus in the table of information on the configuration of the apparatus, excluding the isolated module (S53). Subsequently, the control section 31 computes the expected electric current consumption value of the in-diagnosis electric current metering section on the basis of the table of information on the configuration of the apparatus and the table of information on the modules and enters it in the table of information on the electric current consumption of the apparatus (S54).

Then, the control section 31 executes a test (S55). More specifically, the control section 31 stores the metered value of electric current consumption that is obtained from each of the electric current metering sections in the table of information on the electric current consumption of the apparatus (S61). Thereafter, the control section 31 computes the metered value deviation of the in-diagnosis electric current metering section that is the deviation of the metered electric current consumption value from the expected electric current consumption value of the in-diagnosis electric current metering section (S62). Then, the control section 31 determines if the metered value deviation of the in-diagnosis electric current metering section exceeds the diagnosis deviation or not (S63). If the metered value deviation of the in-diagnosis electric current metering section does not exceed the diagnosis deviation (S63, N), the control section 31 determines that the module that is in trouble is isolated and terminates the flow of operation. If, on the other hand, the metered value deviation of the in-diagnosis electric current metering section exceeds the diagnosis deviation (S63, Y), the control section 31 determines that the module in trouble is not isolated and returns to S51, where it isolates another one of the modules under the in-diagnosis electric current metering section.

As a result of the diagnosis process, if there are a number of modules under the in-diagnosis electric current metering section, it is possible to identify and isolate the module that is in trouble.

While an emergency process or a diagnosis process is executed according to the deviation of the metered electric current consumption value from the predefined expected electric current consumption value in the above-described embodiment, the electric current consumption may alternatively be metered at predetermined regular intervals and an emergency process or a diagnosis process may be executed according to the change in the metered electric current consumption value.

If such is the case, the metered electric current consumption value T-1 obtained as a result of the first test and the metered electric current consumption value T-2 obtained as a result of the second test for each of the electric current metering sections are entered in the table of information on the electric current consumption of the apparatus. Additionally, an emergency variation quantity and a diagnosis variation quantity that are referred to when judging an abnormal situation are defined and entered in the table of information on the modules. The emergency variation quantity and the diagnosis variation quantity are computed for each of the electric current metering sections and entered in the table of information on the electric current consumption of the apparatus. For the purpose of failure monitoring, if the metered value deviation is found within a normal range, the control section 31 computes the variation quantity of the metered value, using the present metered electric current consumption value, the metered electric current consumption value T-1 and the metered electric current consumption value T-2. Then, if the change in the electric current consumption is a monotonous increase or a monotonous decrease that is not correlated with the operation of the information processing apparatus, the control section 31 executes an emergency process when the variation quantity of the metered value exceeds the emergency variation quantity, whereas it executes a diagnosis process when the variation quantity of the metered value exceeds the diagnosis variation quantity.

While the failure monitoring operation is carried out when the information processing apparatus 1 is started to operate or at the time of a regular checkup in the above description of the embodiment, it may alternatively be carried out while the information processing apparatus 1 is operating. If such is the case, an emergency deviation and a diagnosis deviation are defined in the table of information on the modules for each module and for each operation mode of the information processing apparatus 1. The emergency deviation and the diagnosis deviation are computed for each of the electric current metering sections and entered in the table of information on the electric current consumption of the information processing apparatus 1 depending on the operation mode of the apparatus 1. In a failure monitoring operation, the control section 31 judges if an emergency process and/or a diagnosis process need to be executed or not, referring to the emergency deviation and the diagnosis deviation that vary depending on the operation mode of the information processing apparatus 1.

While the electric current is metered for the failure monitoring operation in the above-described embodiment, the electric power or the voltage may alternatively be metered for the failure monitoring operation.

According to the invention, there is also provided a failure monitoring computer program for having the computer of an information processing apparatus execute the above described steps. Such a computer program can be executed by the computer of the information processing apparatus when the computer program is stored in a computer-readable recording medium. Computer-readable recording mediums that can be used for the purpose of the present invention include portable recording mediums such as CD-ROMs, flexible disks, DVD disks, magneto-optical disks and IC cards, data bases adapted to hold computer programs, and other computers and their data bases.

Note that a power supply metering section corresponds to an electric current metering section of the above-described embodiment and a module corresponds to a PSU and a module of the above-described embodiment, whereas a first normal range corresponds to the diagnosis deviation of the above-described embodiment and a second normal range corresponds to the emergency deviation of the above-described embodiment.

What is claimed is:

1. An information processing apparatus that monitors failures comprising:
   a plurality of modules that are provided for an information processing feature;
   a plurality of switches that are provided respectively for the plurality of modules so as to turn on and off a power supply to the respective modules;
   a power supply metering section that meters the power supply to the plurality of modules;
   a memory section that stores a normal range of power supply in advance; and
   a control section that controls the plurality of switches so as to turn off the power supply to a specific module when the outcome of the metering by the power supply metering section is out of the normal range of power supply as stored in the memory section, wherein
   the memory section stores a normal range of power supply for each of the plurality of modules in advance; and
   the control section computes the normal range of power supply for the power supply metering section on the basis of the normal range of power supply for each of the plurality of modules and the configuration of the plurality of modules in the information processing apparatus,
   while the memory section stores the normal range of power supply for the power supply metering section.

2. The information processing apparatus according to claim 1, wherein the control section recognizes the configuration of the plurality of modules in the information processing apparatus by communicating with the plurality of modules.

3. The information processing apparatus according to claim 1, wherein
   the memory section stores a first normal range of power supply and a second normal range of power supply that is broader than the first normal range of power supply in advance as the normal range of power supply; and
   the control section turns off the power supply to all the plurality of modules when the metered power supply is out of the second normal range of power supply but identifies the an abnormal module and turns off the power supply to the abnormal module when the metered power supply is out of the first normal range of power supply.

4. The information processing apparatus according to claim 3, wherein,
   when the power supply is out of the first normal range of power supply, the control section selects one of the plurality of modules operating under the power supply metering section for which the power supply is detected to be abnormal, turns off the power supply to the selected module and repeats the selection of one of the plurality of modules until the abnormal power supply is no longer detected on the basis of the outcome of the metering by the power supply metering section and the normal range of power supply stored in the memory section.

5. The information processing apparatus according to claim 1, wherein
   the power supply metering section meters the electric current consumption of the plurality of modules; and
   the memory section stores the normal range of power supply as the electric current consumption.

6. The information processing apparatus according to claim 1, wherein
   the memory section further stores a normal range of power supply for a change in the power supply to the power supply metering section and an outcome of past metering operations of the power supply metering section; and
   the control section controls the plurality of switches so as to turn off the power supply to a specific module when the change in the power supply as obtained from the outcome of the past metering operations of the power supply metering section is out of the normal range of power supply for changes in the power supply as stored in the memory section.

7. A failure monitoring method of monitoring failures of an information processing apparatus having a plurality of modules, the method comprising:
   a storing step that stores a normal range of power supply to the plurality of modules in advance;
   a power supply metering step that meters the power supply to the plurality of modules; and
   a control step that turns off the power supply to a specific module when the power supply to the specific module is out of the normal range of power supply as stored in the storing step as a result of the metering in the power supply metering step, wherein
   the storing step comprises storing a normal range of power supply for each of the plurality of modules in advance; and
   the control step comprises computing the normal range of power supply for the power supply metering step on the basis of the normal range of power supply for each of the plurality of modules and the configuration of the plurality of modules in the information processing apparatus, while the storing step also comprises storing the normal range of power supply for the power supply metering step.

8. The failure monitoring method according to claim 7, wherein the control step comprises recognizing the configuration of the plurality of modules in the information processing apparatus by communicating with the plurality of modules.

9. The failure monitoring method according to claim 7, wherein
the storing step comprises storing a first normal range of power supply and a second normal range of power supply that is broader than the first normal range of power supply in advance as the normal range of power supply; and
the control step comprises turning off the power supply to all of the plurality of modules when the metered power supply is out of the second normal range of power supply but identifying an abnormal module and turning off the power supply to the abnormal module when the metered power supply is out of the first normal range of power supply.

10. The failure monitoring method according to claim 9, wherein,
when the power supply is out of the first normal range of power supply, the control step comprises selecting one of the plurality of modules operating under the power supply metering step in which the power supply is detected to be abnormal, turning off the power supply to the selected module and repeating the selection of one of the plurality of modules until the abnormal power supply is no longer detected on the basis of the outcome of the metering in the power supply metering step and the normal range of power supply stored in the storing step.

11. The failure monitoring method according to claim 7, wherein
the power supply metering step comprises metering the electric current consumption of the plurality of modules; and
the storing step comprises storing the normal range of power supply as electric current consumption.

12. The failure monitoring method according to claim 7, wherein
the power supply metering step is conducted for each of the plurality of modules or each group of modules formed by dividing the plurality of modules.

13. A failure monitoring method of monitoring failures of an information processing apparatus having a plurality of modules, the method comprising:
a storing step that stores a normal range of power supply to the plurality of modules in the information processing apparatus in advance;
a power supply metering step that meters the power supply to the plurality of modules; and
a control step that turns off the power supply to a specific module when the power supply to the specific module is out of the normal range of power supply as stored in the storing step as a result of the metering in the power supply metering step, wherein
the storing step further comprises storing a normal range of power supply for a change in the power supply in the power supply metering step and the outcome of the past metering operations of the power supply metering step; and
the control step comprises turning off the power supply to the specific module when the change in the power supply as obtained from the outcome of the past metering operations in the power supply metering step is out of the normal range of power supply for changes in the power supply as stored in the storing step.

14. A failure monitoring computer program embodied in a computer readable storage medium for causing a computer to execute a failure monitoring method of monitoring failures of an information processing apparatus having a plurality of modules, the method comprising:
a storing step that stores a normal range of power supply to the plurality of modules in the information processing apparatus in advance;
a power supply metering step that meters the power supply to the plurality of modules; and
a control step that turns off the power supply to a specific module when the power supply to the specific module is out of the normal range of power supply as stored in the storing step as a result of the metering in the power supply metering step, wherein
the storing step further comprises storing a normal range of power supply for a change in the power supply in the power supply metering step and the outcome of the past metering operations of the power supply metering step; and
the control step comprises turning off the power supply to a specific module when the change in the power supply as obtained from the outcome of the past metering operations in the power supply metering step is out of the normal range of power supply for changes in the power supply as stored in the storing step.

* * * * *

UNITED STATES PATENT AND TRADEMARK OFFICE
CERTIFICATE OF CORRECTION

| | | |
|---|---|---|
| PATENT NO. | : 7,212,954 B2 | Page 1 of 1 |
| APPLICATION NO. | : 11/104606 | |
| DATED | : May 1, 2007 | |
| INVENTOR(S) | : Kazuhiko Amano | |

It is certified that error appears in the above-identified patent and that said Letters Patent is hereby corrected as shown below:

Column 10, Line 8, after "identifies" delete "the".

Signed and Sealed this

Fourteenth Day of August, 2007

JON W. DUDAS
*Director of the United States Patent and Trademark Office*